United States Patent
Narathong et al.

(10) Patent No.: US 7,719,313 B2
(45) Date of Patent: May 18, 2010

(54) VERSATILE AND COMPACT DC-COUPLED CML BUFFER

(75) Inventors: Chiewcharn Narathong, Laguna Niguel, CA (US); Wenjun Su, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/560,737

(22) Filed: Nov. 16, 2006

(65) Prior Publication Data

US 2008/0001633 A1 Jan. 3, 2008

Related U.S. Application Data

(60) Provisional application No. 60/817,595, filed on Jun. 28, 2006, provisional application No. 60/833,059, filed on Jul. 24, 2006.

(51) Int. Cl.
*H03K 19/094* (2006.01)
*H03K 3/00* (2006.01)

(52) U.S. Cl. .................... 326/83; 326/87; 327/108; 327/109

(58) Field of Classification Search ............... 326/83, 326/87; 327/108, 109, 55, 57
See application file for complete search history.

(56) References Cited

U.S. PATENT DOCUMENTS

| 5,818,278 | A | | 10/1998 | Yamamoto et al. | |
|---|---|---|---|---|---|
| 6,154,064 | A | * | 11/2000 | Proebsting | 327/55 |
| 6,254,064 | B1 | * | 7/2001 | Gibbs | 256/22 |
| 7,091,754 | B2 | | 8/2006 | Lu et al. | |
| 7,282,981 | B2 | * | 10/2007 | Nomura | 327/333 |
| 2006/0061405 | A1 | * | 3/2006 | Zerbe | 327/336 |

FOREIGN PATENT DOCUMENTS

| EP | 0215280 | 3/1987 |
|---|---|---|
| GB | 2030405 | 4/1980 |
| GB | 2294143 | 4/1996 |

OTHER PUBLICATIONS

International Search Report—PCT/US07/071496 International Search Authority—European Patent Office—Mar. 5, 2008.
Written Opinion—PCT/US07/071496, International Search Authority—European Patent Office—Mar. 5, 2008.

\* cited by examiner

*Primary Examiner*—James H. Cho
*Assistant Examiner*—Thienvu V Tran
(74) *Attorney, Agent, or Firm*—Jiayu Xu

(57) ABSTRACT

Differential signal output nodes of a novel CML buffer are DC-coupled by contiguous conductors to the differential signal input nodes of a load (for example, a CML logic element). The CML buffer includes a pulldown load latch that increases buffer transconductance and that provides a DC bias voltage across the conductors and onto the input nodes of the load, thereby obviating the need for the load to have DC biasing circuitry. Capacitors of a conventional AC coupling between buffer and load are not needed, thereby reducing the amount of die area needed to realize the circuit and thereby reducing the capacitance of the buffer-to-load connections. Switching power consumption is low due to the low capacitance buffer-to-load connections. Differential signals can be communicated from buffer to load over a wide frequency range of from less than five kilohertz to more than one gigahertz with less than fifty percent signal attenuation.

9 Claims, 5 Drawing Sheets

US 7,719,313 B2

VERSATILE AND COMPACT DC-COUPLED CML BUFFER

CROSS-REFERENCE TO RELATED APPLICATION

This application claims the benefit under 35 U.S.C. §119 of Provisional Applications Ser. No. 60/817,595, filed Jun. 28, 2006, and Ser. No. 60/833,059, filed on Jul. 24, 2006 said provisional applications are incorporated herein by reference.

BACKGROUND INFORMATION

1. Technical Field

The disclosed embodiments relate to CML logic buffers and to the communication of signals from CML logic buffers to loads.

2. Background Information

Digital logic circuitry is being used in applications involving signals of ever increasing frequencies. Within a cellular telephone, for example, digital circuitry is now used to realize high speed frequency dividers. The receiver chain of a cellular telephone, for example, may include a local oscillator having a phase locked loop. The frequency divider in the feedback loop of the phase-locked loop may be a digital counter. Parts of this counter, for speed reasons, may be realized in a type of logic referred to as "current mode logic" (CML). One type of CML logic gate is a buffer (sometimes called a "clock driver").

FIG. 1 (Prior Art) is a diagram of a conventional non-inverting CML buffer 1 that is AC-coupled in conventional manner to a load 2. The load has two differential signal input nodes 3 and 4 for receiving differential signals. N-channel field effect transistors (FETs) 5 and 6 and resistors 7 and 8 represent circuitry that is typical of a CML load. The gate of transistor 5 is coupled to the load's differential signal input node 3. The gate of transistor 6 is coupled to the load's differential signal input node 4. Load 2 works properly when a DC bias voltage of an appropriate magnitude is present on the gates of transistors 5 and 6. The differential signals that are received on input nodes 3 and 4 transition above and below this DC bias voltage. Resistors 9 and 10 represent a biasing network that places an appropriate DC voltage VBIAS2 on the gates of transistors 5 and 6.

Buffer 1 receives differential CML input signals on a pair of differential signal input nodes 11 and 12 and drives differential CML output signals out of a pair of differential signal output nodes 13 and 14 to load 2. Buffer 1 typically involves an N-channel FET pulldown current source structure 15 that serves as the load for a pair of input N-channel pullup FETs 16 and 17. Current mirror structure 15 operates to sink DC bias currents 18 and 19 from output nodes 13 and 14, respectively. A remotely located bias voltage generator typically supplies a bias voltage VBIAS1 that determines the magnitudes of DC bias currents 18 and 19. When the received differential CML input signals are received onto differential signal input nodes 11 and 12, the transistors 16 and 17 are to communicate the differential signals onto differential signal output nodes 13 and 14. Each of the differential signal input signals varies over a voltage range and typically has a DC bias voltage offset. The DC bias voltages of the differential CML input signals in combination with the source-follower operation of transistors 16 and 17 and DC bias currents 18 and 19 serve to establish a DC bias voltage on differential signal output nodes 13 and 14. This DC bias voltage on the differential signal output nodes of buffer 1 is generally different than the DC bias voltages VBIAS2 that should be present on the gates of transistors 5 and 6 of load 2. The differential signal output nodes 13 and 14 of buffer 1 are therefore AC-coupled through capacitors 20 and 21 to the differential signal input nodes 3 and 4 of load 2. This allows the DC bias voltages of the buffer and load to be different, but allows transitioning differential signals to pass from buffer 1 to load 2.

FIG. 2 (Prior Art) is a waveform diagram that illustrates operation of conventional buffer 1 of FIG. 1. The upper waveform shows how a relatively high frequency signal having a pulse width of five hundred picoseconds passes through capacitors 20 and 21 from the buffer to the load. A lower frequency signal, however, is rejected due to the AC-coupling. The lower the frequency of the signal, the more the signal is rejected. The lower waveform shows how a relatively low frequency signal having a pulse width of ten microseconds is largely rejected by the AC coupling between buffer and load. By the end of the ten microsecond pulse of a digital logic value "high", the voltage level of the signal has nearly fallen to a voltage defined to be the opposite digital logic value (a digital logic value "low"). By the end of the ten microsecond pulse, ninety percent of the signal has been attenuated. Accordingly, a typical CML buffer that is AC-coupled to its load may be employed only where the signals to be communicated to the load are of an adequately high frequency such that the desired signals make it to the load with adequate signal strength. A more versatile buffer circuit is desired.

SUMMARY

A pair of differential signal output nodes of a novel and compact CML buffer is DC-coupled by a pair of contiguous conductors to a corresponding pair of differential signal input nodes of a load. An example of the load is a CML logic element. The novel CML buffer involves a circuit referred to as a "pulldown load latch". The pulldown load latch has a first input node that is coupled to a first of the differential signal output nodes of the CML buffer. The pulldown load latch has a second input node that is coupled to a second of the differential signal output nodes of the CML buffer. In addition to enhancing the transconductance of the CML buffer, the pulldown load latch operates to provide a DC bias voltage across the conductors and onto the differential signal input nodes of the load, thereby obviating the need for the load to have it own DC biasing circuitry. Whereas the DC biasing circuitry of the load would have conventionally involved resistors that would have conventionally occupied a large amount of die area when integrated onto an integrated circuit, the novel CML buffer obviates the need for the load to have such DC biasing circuitry and therefore reduces the amount of die area that must be consumed when realizing the overall buffer and load circuit. Due to the DC-coupling between novel CML buffer and load, the capacitors of a conventional AC-coupled buffer-to-load connection are not used, thereby further reducing the amount of integrated circuit die area needed to realize the novel CML buffer circuit and thereby reducing the capacitance of the buffer-to-load connections. Because the novel CML buffer can be made small and compact due to its not involving the large capacitors of a conventional AC-coupling to a load and due to the load not requiring DC biasing circuitry, the novel CML buffer and its load can be placed close together on an integrated circuit die. Placing the buffer and its load close together allows the contiguous conductors of the DC-coupling connections between buffer and load to be made shorter, and therefore allows the parasitic capacitances of the buffer-to-load connections to be small.

Differential CML signals can be communicated from the novel CML buffer to a CML load over a wide frequency range of from less than five kilohertz to more than one gigahertz with less than fifty percent signal attenuation. Whereas in a conventional CML buffer the signal level of a pulse of long duration may degrade over the duration of the long pulse due to the AC coupling between buffer and load, the signal level of a pulse of long duration output by the novel CML buffer does not degrade over the time. Accordingly, the novel CML buffer can be employed to drive a differential CML signal to a load, where the differential CML signal involves both pulses of long durations as well as pulses of short durations. The novel CML buffer is there therefore more versatile that a conventional CML buffer that is AC-coupled to its load and that cannot communicate long pulses without substantial signal degradation.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the devices and/or processes described herein, as defined solely by the claims, will become apparent in the non-limiting detailed description set forth herein.

DETAILED DESCRIPTION

Figure 3:
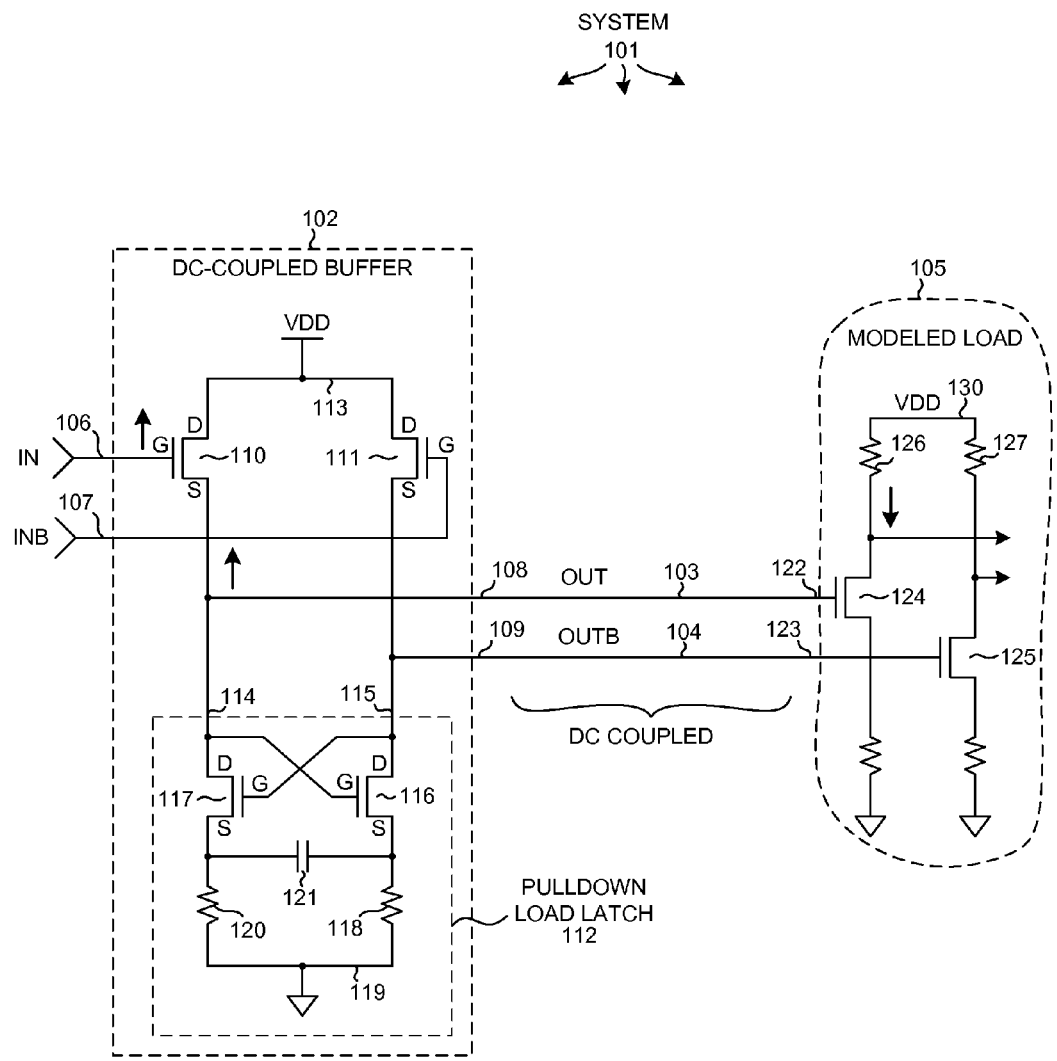
FIG. 3 is a diagram of system involving a novel CML buffer that is DC-coupled to a load in accordance with a novel aspect.

FIG. 3 is a simplified transistor-level diagram of a system 101 in accordance with one novel aspect. System 101 is integrated onto a single integrated circuit die. System 101 includes a novel DC-coupled non-inverting CML buffer 102 that is DC-coupled by a pair of direct and contiguous connections 103 and 104 to a load 105. The letters "DC" here stand for "direct current". Buffer 102 receives differential CML (current mode logic) input signals on a pair of differential signal input nodes 106 and 107 and outputs corresponding non-inverted versions of the input signals onto a pair of differential signal output nodes 108 and 109. Buffer 102 includes a first N-channel field effect transistor (FET) 110, a second N-channel FET 111, and a pulldown load latch 1 12.

The drain of first transistor 110 is coupled to a supply voltage conductor 113. The drain of second transistor 111 is also coupled to the supply voltage conductor 113. The drains of transistors 110 and 111 in FIG. 3 are denoted with the label "D". The sources of transistors 110 and 111 in FIG. 3 are denoted with the label "S", and the gates are denoted with the label "G". Latch 112 is called a "load" latch because it serves as a pair of resistive loads over which voltages are developed. Latch 112 is called a "pulldown" load latch because it works to pull down the voltages on the sources of pullup transistors 110 and 111.

Pulldown load latch 112 has a first input node 114 and a second input node 115. First input node 114 is coupled to first differential signal output node 108 of buffer 102. Second input node 115 is coupled to second differential signal output node 109 of buffer 102. Pulldown load latch 112 includes a pair of cross-coupled N-channel FETs 116 and 117. The source of transistor 116 is resistively coupled by a resistor 118 to a ground conductor 119. The source of transistor 117 is resistively coupled by a resistor 120 to ground conductor 119. The gate of transistor 116 is coupled to first input node 114 of latch 112. The gate of transistor 117 is coupled to second input node 115 of latch 112. A first terminal of a capacitor 121 is coupled to the source of transistor 116 and a second terminal of capacitor 121 is coupled to the source of transistor 117. Pulldown load latch 112 provides a differential pulldown impedance between first input node 114 and ground conductor 119 and second input node 115 and ground conductor 119. The term "differential" here means that the impedance between the first input node 114 and ground conductor 119 is different than the impedance between the second input node 115 and ground conductor 119. Either the impedance between first input node 114 and ground conductor 119 is lower than the impedance between second input node 115 and ground conductor 119, or the impedance between first input node 114 and ground conductor is higher than the impedance between second input node 115 and ground conductor 119. Which one of the first and second input nodes 114 and 115 has the lower impedance to ground conductor 119 is determined by how the latch is latched as explained in further detail below.

Load 105 has a first differential signal input node 122 and a second differential signal input node 123. First and second differential signal input nodes 122 and 123 are input nodes through which load 105 receives CML or CML-like differential signals from buffer 102. Load 105 in FIG. 3 represents a model of one type of CML load that novel buffer 102 may be employed to drive. This load 105 includes a pair of N-channel FETs 124 and 125. In a typical CML load, there are loads 126 and 127 coupled between a VDD supply conductor 130 and the drains of transistors 124 and 125. Although load 105 can be a CML load, load 105 can also be another type of logic circuit load such as, for example, a CMOS (complementary metal oxide semiconductor) load where each input node of the load is coupled to both a gate of P-channel transistor as well as to a gate of an N-channel transistor.

In one novel aspect, load 105 does not include DC voltage biasing circuitry for providing a DC bias voltage onto the differential signal input nodes 122 and 123 of the load. CML load 105, however, is a circuit that works properly when a 1.5 volt DC bias voltage is present on the differential signal input nodes 122 and 123. Each of the differential signals that is received onto input nodes 122 and 123 is to transition above and below this 1.5 volt DC bias voltage. Rather than the differential signal input nodes of the load being AC-coupled by capacitors to the differential signal output nodes of the buffer as in the conventional circuit of FIG. 1 (Prior Art), the differential signal input nodes 122 and 123 of load 105 are DC-coupled by direct and contiguous conductive connections 103 and 104 to the differential signal output nodes 108 and 109 of novel buffer 102. Buffer 102 supplies the proper DC bias voltage across these connections 103 and 104 to the nodes 122 and 123 of load 105. The system of FIG. 3 is therefore said to be "self-biasing". In the specific embodiment of FIG. 3, the DC bias voltage on the gate of transistor 124 of load 105 is the sum of the DC voltage between the gate and source of transistor 116 and the DC voltage dropped across resistor 118. In one example, a 5 kilohertz square wave differential input signal on differential signal input node 106 of buffer 102 has a DC bias voltage of approximately 2.0 volts. This differential input signal has an AC amplitude of between 0.1 volts and 1.0 volts. When buffer 102 is receiving such a signal, the DC gate-to-source voltage of transistor 116 is approximately 1.0 volts and the DC voltage dropped across resistor 118 is approximately 0.5 volts. Buffer 102 therefore operates to supply the desired 1.5 volt DC bias voltage onto the gate of transistor 122 of load 105. The differential signal on input node 122 of load 105 has an AC amplitude of between 0.1 volts and 1.0 volts. Differential voltage changes in the signals IN and INB on nodes 106 and 107 are buffered and output as corresponding differential voltage changes in the signals OUT and OUTB on connections 103 and 104. Because input transistor 110 acts as a source-follower in that its source voltage follows its gate voltage, care is taken to ensure that the DC bias voltage of the differential input signal on node 106 is of the appropriate magnitude such that when the gate-to-source voltage drop across transistor 110 is subtracted from the DC bias voltage of the input signal on node 106, the resulting voltage is the proper DC bias voltage that is expected on node 122 of load 105.

The operation of latch 112 is now explained. Assume initially that latch 112 is latched such that transistor 116 is less conductive than transistor 117. Due to the cross-coupled configuration of transistors 116 and 117, the impedance between first input node 114 and ground conductor 119 is lower than is the impedance between second input node 115 and ground conductor 119. Initially, differential input signals IN and INB on the differential signal input nodes 106 and 107 of buffer 102 are such that the voltage on node 106 is lower than the voltage on node 107. Transistor 110 is therefore less conductive than is transistor 111. The voltage on differential signal output node 108 of buffer 102 is therefore pulled down by pulldown load latch 112 to be lower than the voltage on differential signal output node 109. Signal OUT therefore has a lower voltage than does signal OUTB.

Next, the differential input signals IN and INB on input nodes 106 and 107 transition such that the voltage on node 106 increases with respect to the voltage on node 107. This makes transistor 110 more conductive and transistor 111 less conductive. The voltage on node 108 increases. Transistor 110 eventually becomes so conductive that it overpowers the smaller transistor 117 of latch 112. The voltages on input nodes 114 and 115 of latch 112 then cross such that the voltage on the gate of transistor 116 is higher than the voltage on the gate of transistor 117. Latch 112 responds by switching state and latching such that transistor 116 is now held to be more conductive than transistor 117. The voltage on the differential signal output node 108 of buffer 102 is higher than the voltage on the differential signal output node 109 of buffer 102. The differential output signals OUT and OUTB on nodes 108 and 109 are communicated across connections 103 and 104 to load 105.

When the differential input signals on input nodes 106 and 107 transition such that the voltage on node 106 decreases with respect to the voltage on node 107, then transistor 111 is made more conductive and transistor 110 is made less conductive. The voltage on node 109 increases with respect to the voltage on node 108. Transistor 111 eventually becomes so conductive that it overpowers the smaller transistor 116 of latch 112. The voltages on input nodes 114 and 115 of latch 112 then cross such that the voltage on the gate of transistor 117 is higher than the voltage on the gate of transistor 116. Latch 112 responds by switching state and latching such that transistor 117 is now held to be more conductive than transistor 116. The voltage of signal OUTB on the differential signal output node 109 of buffer 102 is higher than the voltage of signal OUT on the differential signal output node 108 of buffer 102. The differential output signals OUT and OUTB on nodes 108 and 109 are communicated across connections 103 and 104 to load 105.

Figure 4A:
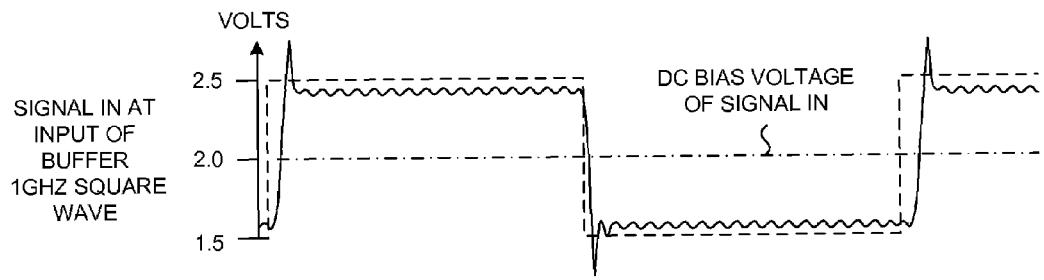
FIG. 4 is a waveform diagram of signals that are supplied to the novel CML buffer of FIG. 3 and of the resulting signals that are output from the novel CML buffer and are received onto input nodes of the load of FIG. 3. One waveform shows the resulting output signal OUT when the signal OUT has a pulse of relatively short duration. A second waveform shows the resulting output signal OUT when the signal OUT has a pulse of relatively long duration.

FIG. 4A is a waveform diagram of the signal IN on differential signal input node 106 in a situation where the signal has a short pulse width of approximately five hundred picoseconds. Signal IN is a one gigahertz square wave that has a DC bias voltage of approximately 2.0 volts, and an AC voltage amplitude of approximately 1.0 volts.

Figure 4B:
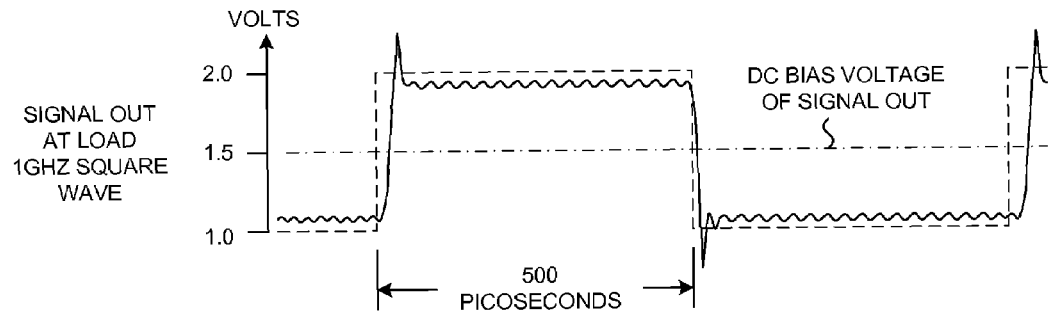

FIG. 4B is a waveform diagram of the signal OUT that appears on input node 122 of load 105 when the signal IN of FIG. 4A is supplied onto differential signal input node 106 of buffer 102. Signal OUT has a DC bias voltage of 1.5 volts, and an AC voltage amplitude of approximately 1.0 volts. The 1.5 volt DC bias voltage is supplied by buffer 102 across connection 103 to the gate of transistor 124 of load 105.

Figure 4C:
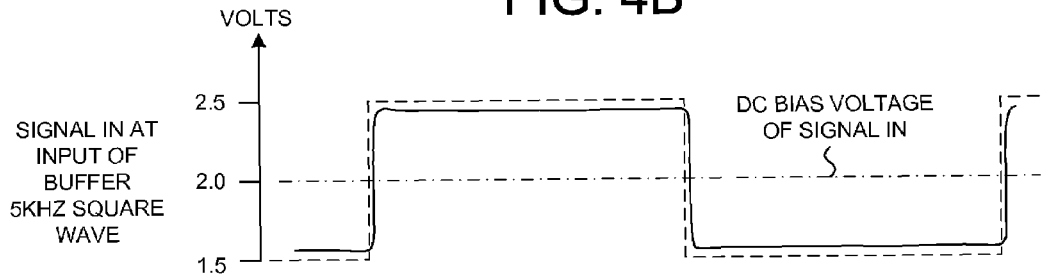

FIG. 4C is a waveform diagram of the signal IN on differential signal input node 106 in a situation where the signal IN has a long pulse width of approximately ten microseconds. Signal IN is a five kilohertz square wave that has a DC bias voltage of approximately 2.0 volts, and an AC voltage amplitude of approximately 1.0 volts.

Figure 4D:
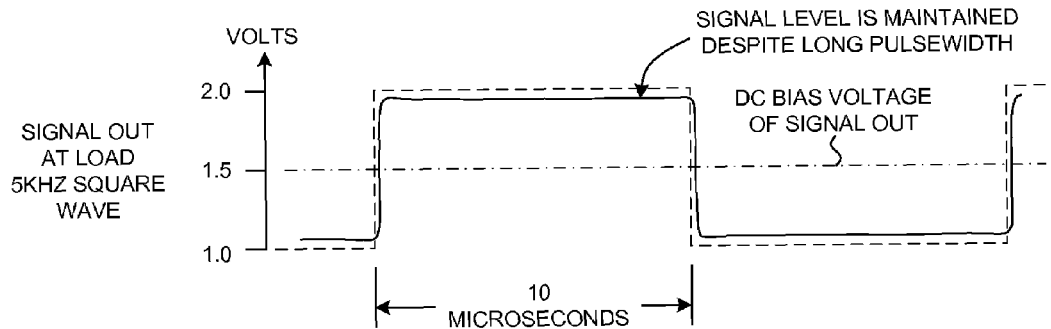

FIG. 4D is a waveform diagram of the signal OUT that appears on input node 122 of load 105 when the signal IN of FIG. 4C is supplied onto differential signal input node 106 of buffer 102. Signal OUT has a DC bias voltage of 1.5 volts, and an AC voltage amplitude of approximately 1.0 volts. The 1.5 volt DC bias voltage is supplied by buffer 102 across connection 103 to the gate of transistor 124 of load 105. Whereas in the prior art situation of FIG. 2 (Prior Art) the signal level on the input of the load decreases over time due to the AC coupling between the buffer and load, the signal level on the input node 122 of load 105 in FIG. 4D remains high at around 2.0 volts and does not decrease over time despite the fact that the high pulse lasts for ten microseconds. The differential signal OUT is communicated to the load with less than fifty percent attenuation over a frequency range from less than approximately five kilohertz to more than one gigahertz. Attenuation in this context is measured from the input node 106 of buffer 102 to the input node 122 of load 105. Accordingly, buffer 102 is more versatile that the conventional buffer 1 of FIG. 1 because buffer 102 is able to communicate a signal to load 105 successfully, where the signal has both very short pulses (for example, pulses of five hundred picoseconds or less) as well as very long pulses (for example, pulses of ten microseconds or more) from buffer 102 to load 105.

In one application, buffer 102 is utilized in a signal path in a multi-modulus divider (MMD) of a local oscillator of an RF transceiver integrated circuit within a cellular telephone. The signal being communicated through the buffer has both a high frequency component (for example, short five hundred picosecond pulses) as well as a much lower frequency component (for example, ten microsecond pulses). Buffer 102 is usable in this signal path as a buffer to communicate the pulses from an output of a CML logic circuit to an input of a CMOS logic circuit.

Figure 1:
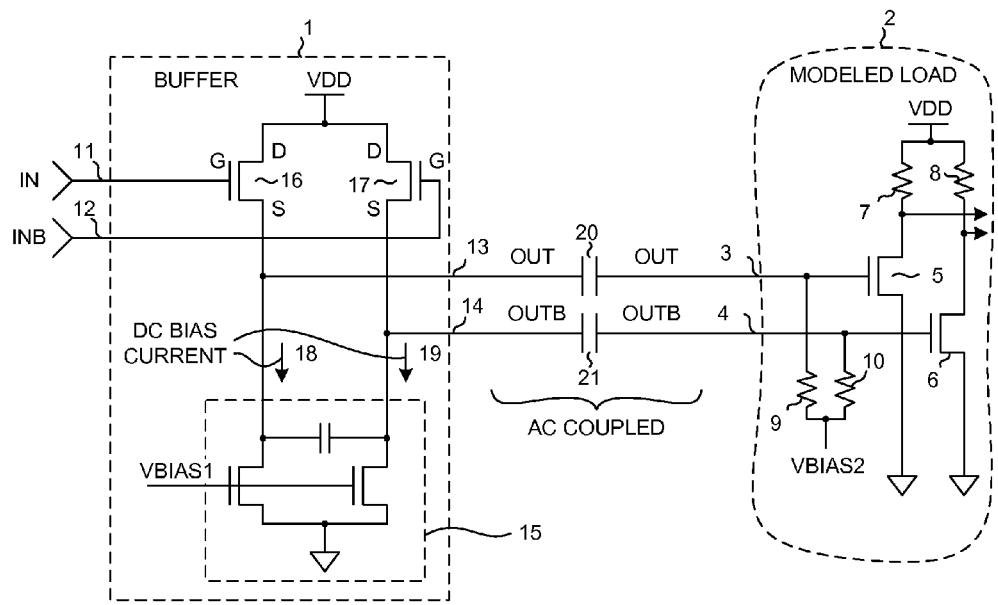
FIG. 1 (Prior Art) is a diagram of conventional CML buffer that is AC-coupled to a load.
Figure 2:
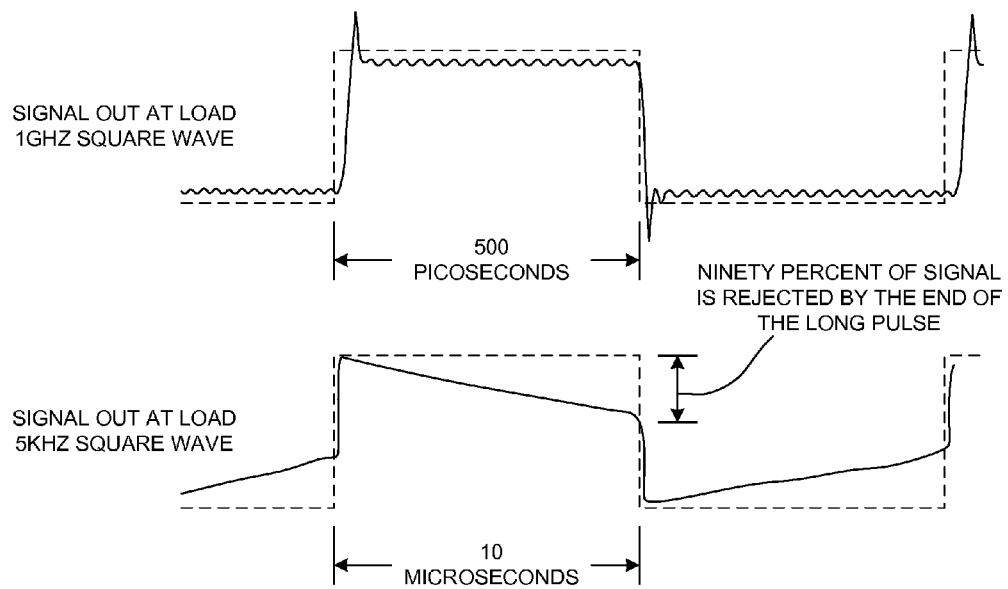
FIG. 2 (Prior Art) is a waveform diagram of a signal that is output from the conventional CML buffer of FIG. 1. In one waveform, the signal has a pulse of a relatively short duration. In another waveform, the signal has a pulse of relatively long duration.

In one advantageous aspect, the DC-coupling between novel buffer 102 and its load does not involve the capacitors 20 and 21 of the prior art of FIG. 1. Each of the capacitors 20 and 21 of the prior art of FIG. 1 may, for example, be a two picofarad capacitor which when realized in integrated circuit form occupies a large amount of integrated circuit area. The novel buffer 102 of FIG. 3 does not require or employ these large capacitors. This has several advantages.

First, not having to provide the capacitors on the integrated circuit along with buffer 102 reduces the amount of integrated circuit area consumed by the buffer, load, and the connections between the buffer and load. Moreover, not having to provide resistors in the load for DC biasing the load further reduces the amount of integrated circuit area required to realize the novel buffer circuit of FIG. 3. The overall reduction in the amount of integrated circuit area required to realize the novel buffer circuit 102 reduces integrated circuit cost in comparison to the prior art AC-coupled circuit of FIG. 1.

Second, not having to provide AC coupling capacitors 20 and 21 of the prior art circuit of FIG. 1 allows load 105 to be placed closer to buffer 102. Reducing the distance between buffer and load reduces the length of the connections between buffer and load, and therefore reduces the parasitic capacitance of these connections. A long signal line conductor on an integrated circuit has a parasitic capacitance between the line itself and neighboring and underlying structures. In the prior art circuit of FIG. 1, the buffer 1 has to charge and discharge this parasitic capacitance as it drives signals to the load. The parasitic capacitance of the conductor-portion of the connections between buffer 1 and load 2 are often as large as five hundred femtofarads (500×10E-15F). Where the signals being driven are very high frequency signals (for example, one gigahertz) that switch very frequently, the buffer may consume a significant amount of power due to its having to charge and discharge the parasitic capacitance of the connections to the load. In the embodiment of FIG. 3, the connections 103 and 104 can be made by relatively short due to buffer 102 being disposed close to load 105. Because connections 103 and 104 are shorter, their parasitic capacitances are smaller. In one example, the total parasitic capacitance of each of connections 103 and 104 is reduced to be less than twenty femtofarads (20×10E-15F).

Third, reducing the parasitic capacitance of the connections 103 and 104 between buffer and load as described above reduces power consumption of the buffer because the buffer does not have to charge and discharge as much capacitance.

Providing capacitor 121 within pulldown load latch 112 is optional. If capacitor 121 is provided, then as the frequency of the differential input signal increases, the impedance of capacitor 121 decreases thereby reducing the impedance between the sources of transistors 116 and 117 and also effectively reducing the impedance between these sources and ground conductor 119. Reducing the impedance between the sources of transistors 116 and 117 and ground conductor 119 results in an increase in the maximum voltage swing of nodes 108 and 109. Increasing the maximum voltage swing of nodes 108 and 109 effectively increases the AC magnitudes of input signals that can be properly received onto differential signal input nodes 106 and 107. Increasing the capacity of buffer 102 to receive input signals of greater AC amplitude is sometimes referred to increasing the buffer's "headroom". Not only does increasing the maximum voltage swing of nodes 108 and 109 increase the buffer's headroom at high frequencies, but increasing the maximum voltage swing of nodes 108 and 109 also serves to increases the capacity of buffer 102 to convert input voltage signals into output current signals (i.e., the transconductance of buffer 102). Accordingly, capacitor 121 causes both the headroom and that transconductance of buffer 102 to increase with increasing input signal frequency.

Buffer 102 has a DC offset transfer function (a DC offset gain) of less than unity. This means that if the DC bias offset voltage of the input signals received onto differential signal input nodes 106 and 107 is off with respect to the ideal DC bias offset by a certain DC voltage (DC input offset), then the buffer 102 will supply the corresponding output signal onto load 105 with a DC bias voltage that differs from the ideal DC bias voltage at the load by another DC voltage (DC output offset). The magnitude of the DC output offset is, however, smaller than the magnitude of the DC input offset. Accordingly, using buffer 102 to buffer a differential signal will not make the DC bias offset larger at load 105 than it would be if buffer 102 were not in the signal path, but rather using buffer 102 in the signal path will make the DC bias offset at load smaller. Multiple instantiations of the novel CML buffer can be chained together in series without the DC offset increasing as a signal passes down the chain of buffers.

Figure 5:
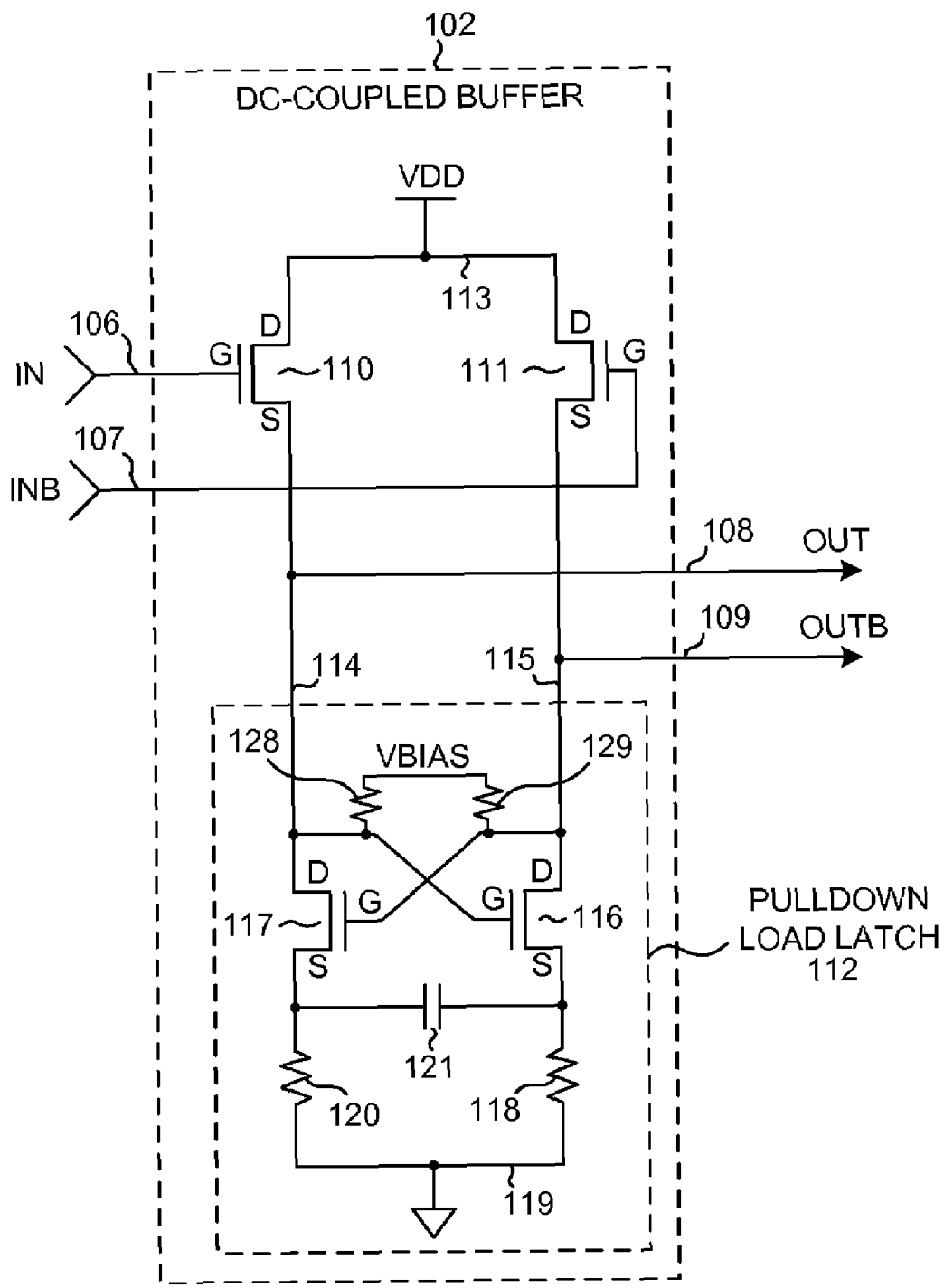
FIG. 5 is a diagram of an embodiment of the novel CML buffer where the CML buffer includes a pair of resistors for adjusting the DC bias voltage that the CML buffer supplies to the load.

FIG. 5 is a diagram of another embodiment of buffer 102. In the embodiment of FIG. 5, two biasing resistors 128 and 129 are provided. Resistor 128 resistively couples the gate of transistor 116 to a DC bias voltage VBIAS. Resistor 129 resistively coupled the gate of transistor 117 to a DC bias voltage VBIAS. The "self-biasing" DC bias voltage that buffer 102 provides to its load can be adjusted by adjusting the voltage VBIAS.

Figure 6:
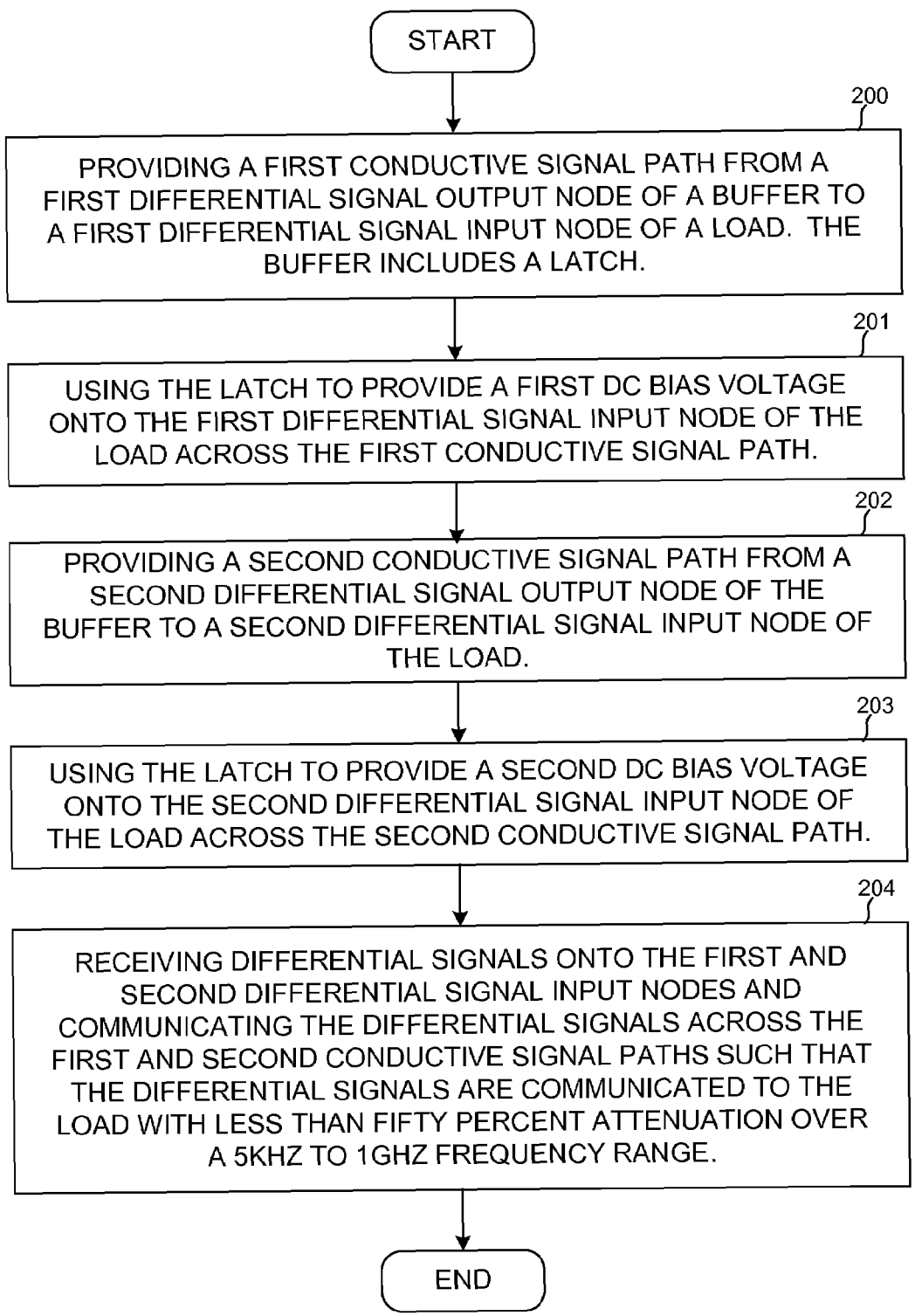
FIG. 6 is a flowchart of a method of operation of the novel CML buffer of FIG. 3.

FIG. 6 is a flowchart of a novel method in which a buffer that is DC-coupled to a load: 1) provides a DC bias voltage to the load, and 2) communicates differential signals to the load with less than fifty percent attenuation over wide frequency range of from five kilohertz to one gigahertz. A first conductive signal path is provided (step 200) from first differential signal output node 108 of buffer 102 of FIG. 3 to first differential signal input node 122 of load 105 of FIG. 3. The first conductive signal path is a direct connection by a first contiguous conductor from the output node to the input node. There is no intervening capacitor as in the AC-coupled example of FIG. 1. Pulldown load latch 112 of FIG. 3 is used (step 201) to provide a DC bias voltage across connection 103 to first differential signal input node 122 of load 105. A second conductive signal path is provided (step 202) from second differential signal output node 109 of buffer 102 to second differential signal input node 123 of load 105. The second conductive signal path is a direct connection by a second contiguous conductor from the output node to the input node. Pulldown load latch 112 is used (step 203) to provide a DC bias voltage across connection 104 to second differential signal input node 123 of load 105. Not only does buffer 102 DC bias the input nodes of load 105, but buffer 102 also receives differential signals onto the first and second differential signal input nodes 106 and 107 of buffer 102 and communicates these signals to load 105 across the first and second conductive signal paths to the first and second differential signal input nodes 122 and 123 of load 105 with less than fifty percent attenuation over a wide five kilohertz to one gigahertz frequency range. Attenuation is measured between the differential signal input nodes 106 and 108 of buffer 102 and differential signal input nodes 122 and 123 of load 105.

Although certain specific embodiments are described above for instructional purposes, the teachings of this patent document have general applicability and are not limited to the specific embodiments described above. Although the use of a pulldown load latch is described above in connection with a buffer having a single pair of differential signal inputs, the pulldown load latch is usable in logic gates having more than one pair of differential signal input nodes. The technique described above of DC-coupling the output of a CML circuit to a load and using the DC-coupling to supply a DC bias voltage to the load is extendable to use in other types of circuits such as, for example, a CML NOR gate. Although an illustrative example of the novel CML buffer is described above in connection with an application in a multi-modulus divider (MMD) within a cellular telephone, the novel CML buffer has general applicability in applications other than in MMDs and cellular telephones. Accordingly, various modifications, adaptations, and combinations of the various features of the described specific embodiments can be practiced without departing from the scope of the claims that are set forth below.

What is claimed is:

1. A buffer circuit comprising:
   a first differential signal input node;
   a second differential signal input node;
   a first differential signal output node;
   a second differential signal output node;
   a first field effect transistor (FET) having a source, a drain and a gate, wherein the gate is coupled to the first differential signal input node, and wherein the source is directly coupled to the first differential signal output node;
   a second field effect transistor (FET) having a source, a drain and a gate, wherein the drain is coupled to the drain of the first FET, wherein the gate is coupled to the second differential signal input node, and wherein the source is directly coupled to the second differential signal output node; and
   a latch having a first input node and a second input node, wherein the first input node of the latch is the first differential signal output node, and wherein the second input node of the latch is the second differential signal output node, wherein the latch further comprises:
      a third field effect transistor (FET) having a source, a drain, and a gate;
      a fourth field effect transistor (FET) having a source, a drain and gate, wherein the drain of the fourth FET is directly coupled to the source of the second FET and the drain of the third FET is directly coupled to the source of the first FET;
      a first resistor having a first terminal coupled to the source of the third FET and a second terminal coupled to ground;
      a second resistor having a first terminal coupled to the source of the fourth FET and a second terminal coupled to ground; and
      a capacitor having a first terminal and a second terminal, the first terminal being coupled to the source of the third FET and the first terminal of the first resistor, and the second terminal being coupled to the source of the fourth FET and the first terminal of the second resistor;
      wherein the drain of the third FET is coupled to the gate of the fourth FET, wherein the gate of the fourth FET is coupled to the first input node of the latch, wherein the drain of the fourth FET is coupled to the gate of the third FET, and wherein the gate of the fourth FET is coupled to the drain of the third FET.

2. The buffer circuit of claim 1, wherein the buffer circuit receives a signal onto its first differential signal input node and communicates the signal from its first differential signal output node to a differential signal input node of a load such that the signal is communicated from the first differential signal input node of the buffer circuit to the differential signal input node of the load with less than fifty percent attenuation over a frequency range from less than approximately five kilohertz to more than one gigahertz.

3. The buffer circuit of claim 1, wherein the first and second differential signal output nodes are DC-coupled to a pair of differential signal input nodes of a load.

4. The buffer circuit of claim 3, wherein the buffer circuit has a DC transfer function ratio from its first and second differential signal input nodes to the pair of differential signal input nodes of the load, and wherein the DC transfer function ratio is less than unity over a frequency range from less than approximately five kilohertz to more than one gigahertz.

5. A system comprising:
   a load comprising a field effect transistor (FET), wherein the FET has a gate, and wherein the gate is a signal input node of the load; and
   a buffer circuit having first and second differential signal input leads and first and second differential signal output leads, wherein the first differential signal output lead is DC-coupled to the signal input node of the load, the buffer circuit comprising:
      a first field effect transistor (FET) having a source, a drain and a gate, wherein the drain is coupled to receive a supply voltage, wherein the gate is the first differential signal input lead of the buffer circuit, and wherein the source is directly coupled to the first differential output lead of the buffer circuit;
      a second field effect transistor (FET) having a source, a drain and a gate, wherein the drain is coupled to the drain of the first FET, wherein the gate is the second differential signal input lead of the buffer circuit, and wherein the source is directly coupled to the second differential signal output lead of the buffer circuit; and
      a latch having a first input node and a second input node, wherein the first input node is coupled to the first differential signal output lead of the buffer circuit, wherein the second input node is coupled to the second differential signal output lead of the buffer circuit, wherein the latch further comprises:
         a third field effect transistor (FET) having a source, a drain, and a gate;
         a fourth field effect transistor (FET) having a source, a drain and gate, wherein the drain of the fourth FET is directly coupled to the source of the second FET and the drain of the third FET is directly coupled to the source of the first FET;
         a first resistor having a first terminal coupled to the source of the third FET and a second terminal coupled to ground;
         a second resistor having a first terminal coupled to the source of the fourth FET and a second terminal coupled to ground; and
         a capacitor having a first terminal and a second terminal, the first terminal being coupled to the source of the third FET and the first terminal of the first resistor, and the second terminal being coupled to the source of the fourth FET and the first terminal of the second resistor;
         wherein the drain of the third FET is coupled to the gate of the fourth FET, wherein the gate of the fourth FET is coupled to the first input node of the latch, wherein the drain of the fourth FET is coupled to the gate of the third FET, and wherein the gate of the fourth FET is coupled to the drain of the third FET.

6. The system of claim 5, wherein the latch comprises a pair of cross-coupled N-channel field effect transistors.

7. The system of claim 5, wherein the first differential signal output lead of the buffer circuit is DC-coupled to the signal input node of the load by a contiguous conductor that extends from the first differential signal output lead of the buffer circuit to the signal input node of the load.

8. A system comprising:

a load; and means for buffering a current mode logic (CML) differential signal and for driving the CML differential signal from the means to the load, wherein the means is DC-coupled to the load, and wherein the means is for buffering the CML differential signal such that the CML differential signal is communicated to the load with less than fifty percent attenuation over a frequency range from less than approximately five kilohertz to more than one gigahertz;

wherein the means for buffering comprises a latch, and wherein the latch comprises:

a first field effect transistor (FET) having a source, a drain, and a gate;

a second field effect transistor (FET) having a source, a drain and gate;

a first resistor having a first terminal coupled to the source of the first FET and a second terminal coupled to ground;

a second resistor having a first terminal coupled to the source of the second FET and a second terminal coupled to ground; and a capacitor having a first terminal and a second terminal, the first terminal being coupled to the source of the first FET and the first terminal of the first resistor, and the second terminal being coupled to the source of the second FET and the first terminal of the second resistor.

9. The system of claim 8, wherein the means is a buffer within a multi-modulus divider.

\* \* \* \* \*